(12) United States Patent
Hu et al.

(10) Patent No.: US 8,779,281 B2
(45) Date of Patent: Jul. 15, 2014

(54) SOLAR CELL

(75) Inventors: Yen-Cheng Hu, New Taipei (TW); Peng Chen, New Taipei (TW); Tsung-Pao Chen, Taichung (TW); Shuo-Wei Liang, Hsinchu County (TW); Zhen-Cheng Wu, Taichung (TW); Chien-Jen Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 480 days.

(21) Appl. No.: 13/100,310

(22) Filed: May 4, 2011

(65) Prior Publication Data
US 2012/0097236 A1 Apr. 26, 2012

(30) Foreign Application Priority Data

Oct. 25, 2010 (TW) .............................. 99136353 A

(51) Int. Cl.
*H01L 31/00* (2006.01)
*H01L 31/0216* (2014.01)
*H01L 31/18* (2006.01)

(52) U.S. Cl.
CPC ...... *H01L 31/0267* (2013.01); *H01L 31/02168* (2013.01); *H01L 31/18* (2013.01)
USPC ............. 136/256; 136/252; 136/255; 438/57; 438/66; 438/67; 438/69; 438/72; 438/80; 427/74

(58) Field of Classification Search
CPC ..................... H01L 31/0267; H01L 31/02168; H01L 31/18
USPC .......... 136/252, 255, 256; 438/57, 66, 67, 69, 438/71, 72, 80; 427/74
See application file for complete search history.

(56) References Cited

U.S. PATENT DOCUMENTS

2006/0188400 A1 8/2006 Sasaki
2009/0038669 A1 2/2009 Atanackovic
(Continued)

FOREIGN PATENT DOCUMENTS

CN 101641797 2/2010
JP 2005-019714 1/2005
(Continued)

OTHER PUBLICATIONS

"1st Office Action of China Counterpart Application", issued on Jan. 5, 2012, p. 1-p. 4.

*Primary Examiner* — Matthew Martin
(74) *Attorney, Agent, or Firm* — Jianq Chyun IP Office

(57) ABSTRACT

A solar cell includes a semi-conductive substrate, a doping layer, an anti-reflection layer, an electrode, a passivation stacked layer and a contact layer. The semi-conductive substrate has a front and a back surface. The doping layer is disposed on the front surface. The anti-reflection layer is disposed on the doping layer. The electrode is disposed on the anti-reflection layer and electrically connected to the doping layer. The passivation stacked layer is disposed on the back surface and has a first dielectric layer, a second dielectric layer and a middle dielectric layer sandwiched between the first and the second dielectric layer. The dielectric constant of the middle dielectric layer is substantially lower than the dielectric constant of the first dielectric layer and the dielectric constant of the second dielectric layer. The contact layer covers the passivation stacked layer and electrically contacts with the back surface of the semi-conductive substrate.

19 Claims, 1 Drawing Sheet

(56) References Cited

U.S. PATENT DOCUMENTS

| | | |
|---|---|---|
| 2009/0165855 A1* | 7/2009 | Sun et al. ............... 136/261 |
| 2010/0051096 A1 | 3/2010 | Kim et al. |
| 2010/0084009 A1* | 4/2010 | Carlson et al. ............ 136/255 |
| 2010/0258177 A1* | 10/2010 | Ko et al. ............... 136/256 |

FOREIGN PATENT DOCUMENTS

| | | |
|---|---|---|
| TW | 439197 | 6/2001 |
| TW | 454263 | 9/2001 |
| TW | I240426 | 9/2005 |
| TW | I284140 | 7/2007 |
| TW | I291728 | 12/2007 |
| TW | 200905900 | 2/2009 |
| TW | 200929575 | 7/2009 |
| TW | 200929577 | 7/2009 |
| TW | 201001733 | 1/2010 |
| TW | 201005971 | 2/2010 |
| TW | 201013946 | 4/2010 |

* cited by examiner

SOLAR CELL

CROSS-REFERENCE TO RELATED APPLICATION

This application claims the priority benefit of Taiwan application serial no. 99136353, filed Oct. 25, 2010. The entirety of the above-mentioned patent application is hereby incorporated by reference herein and made a part of this specification.

BACKGROUND OF THE INVENTION

1. Field of the Invention

The invention generally relates to a solar cell, and more particularly to a solar cell within a preferable internal reflective efficiency.

2. Description of Related Art

A silicon-based solar cell is a typical solar cell adopted commercially. A principle behind the silicon-based solar cell is doping a highly purity semiconductor material (silicon) with a dopant to display different characteristics, so as to form p-type semiconductors and n-type semiconductors, and to attach the p-type and n-type semiconductors with each other to form a p-n junction (interface). When sunlight illuminates a p-n structured semiconductor, energy provided by photons may excite electrons in the semiconductors to generate electron-hole pairs. By configuring electrodes such that holes move towards an electric field direction and electrons move towards an opposite direction (contrary direction) to the electric field direction, a solar cell can be formed. Typically speaking, in order to improve the solar cell, it is pertinent to enhance a photoelectric conversion efficiency of the solar cell.

However, in conventional solar cells, as the thickness of the semiconductor material becomes thinner, a reflective efficiency of the solar cell decreases. In other words, a transmission rate of light passing through the semiconductor material is high, causing a light reusability rate inside the solar cell, or the reflectivity in the solar cell to decrease, and thereby lowering a light absorption rate. Therefore, a photoelectric conversion efficiency of the solar cell is low.

SUMMARY OF THE INVENTION

Accordingly, the invention is directed to a solar cell having a preferable reflective efficiency for a light (e.g. infrared light).

An embodiment of the invention provides a solar cell, including a semi-conductive substrate, a doping layer, an anti-reflection layer, an electrode, a passivation stacked layer, and a contact layer. The semi-conductive substrate has a front surface and a back surface. The doping layer is disposed on the front surface of the semi-conductive substrate. The anti-reflection layer is disposed on the doping layer. The electrode is disposed on the anti-reflection layer and is electrically connected to the doping layer. The passivation stacked layer is disposed on the back surface of the semi-conductive substrate, and the passivation stacked layer includes a first dielectric layer, a second dielectric layer, and a middle dielectric layer sandwiched between the first dielectric layer and the second dielectric layer. In particular, a dielectric constant of the middle dielectric layer is substantially lower than a dielectric constant of the first dielectric layer and a dielectric constant of the second dielectric layer. The contact layer covers the passivation stacked layer and electrically contacts with the back surface of the semi-conductive substrate.

In summary, in a solar cell according to an embodiment of the invention, the passivation stacked layer includes the first electric layer, the middle dielectric layer, and the second dielectric layer, in which the dielectric constant of the middle dielectric layer is substantially lower than the dielectric constant of the first dielectric layer and the dielectric constant of the second dielectric layer. Since the dielectric constant of the middle dielectric layer is sufficiently low, therefore, the reflective efficiency of light (e.g. infrared light) in the solar cell can be enhanced, thereby increasing the performance of the solar cell.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
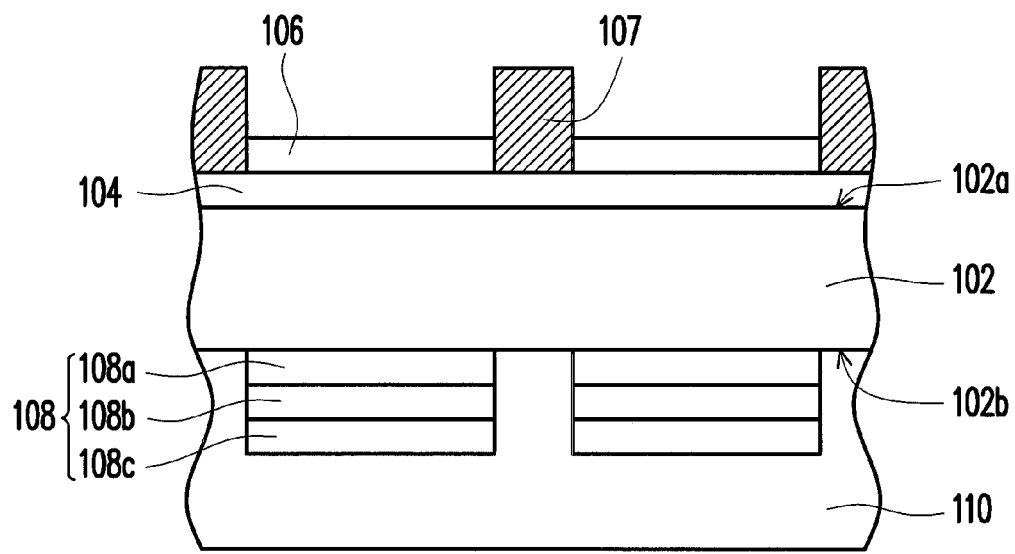
FIG. 1 is a schematic cross-sectional view of a solar cell according to an embodiment of the invention.

FIG. 1 is a schematic cross-sectional view of a solar cell according to an embodiment of the invention. Referring to FIG. 1, the solar cell of the present embodiment includes a semi-conductive substrate 102, a doping layer 104, an anti-reflection layer 106, an electrode 107, a passivation stacked layer 108, and a contact layer 110.

The semi-conductive substrate 102 has a front surface 102a and a back surface 102b. In the embodiment, the semi-conductive substrate 102 is, for example, a semiconductor material doped with a p-type dopant. The p-type dopant may be selected from the group III elements of the periodic table of elements, for example boron (B), aluminum (Al), gallium (Ga), indium (In), etc. In addition, a material of the semi-conductive substrate may be silicon, CdS, CuInGaSe$_2$ (CIGS), CuInSe$_2$ (CIS), CdTe, a semiconductor organic material, or a multi-layered structure including the aforementioned materials. The silicon may include single crystal silicon, polycrystal silicon, amorphous silicon, or microcrystal silicon.

The doping layer 104 is disposed on the front surface 102a of the semi-conductive substrate 102. In the embodiment, the doping layer 104 is, for example, a semiconductor material doped with an n-type dopant. In other words, the dopant type of the semi-conductive substrate 102 is contrary to the dopant type of the doping layer 104. For example, the semi-conductive substrate 102 has the n-type dopant while the doping layer 104 has the p-type dopant, or the semi-conductive substrate 102 has the p-type dopant while the doping layer 104 has the n-type dopant. The n-type dopant may be selected from the group V elements of the periodic table of elements, for example phosphorous (P), arsenic (As), antimony (Sb), etc. Similarly, a material of the doping layer 104 may be silicon, CdS, CuInGaSe$_2$ (CIGS), CuInSe$_2$ (CIS), CdTe, a semiconductor organic material, or a multi-layered structure including the aforementioned materials. The silicon may include single crystal silicon, polycrystal silicon, amorphous silicon, or microcrystal silicon.

The anti-reflection layer 106 is disposed on the doping layer 104. The anti-reflection layer 106 may have a single layer or a multi-layer structure, and a material of the anti-reflection layer 106 is, for example, silicon oxynitride, silicon oxide, other anti-reflection materials, or a combination of the aforementioned materials.

The electrode 107 is disposed on the anti-reflection layer 106 and electrically connected to the doping layer 104. More specifically, the electrode 107 penetrates through the anti-reflection layer 106 to be connected (electrically connected) to the doping layer 104. The electrode 107 may have a single layer or a multi-layer structure, and a material of the electrode 107 includes, for example, metallic materials (e.g., aluminum (Al), gold (Au), silver (Ag), copper (Cu), molybdenum (Mo), titanium (Ti), tantalum (Ta)) or transparent conductive oxides. The transparent conductive oxides are, for example, aluminum zinc oxide (AZO), indium zinc oxide (IZO), indium tin oxide (ITO), zinc oxide (ZnO), tin oxide ($SnO_2$), indium oxide ($In_2O_3$), or other transparent conductive materials.

The passivation stacked layer 108 is disposed on the back surface 102b of the semi-conductive substrate 102, and the passivation stacked layer 108 includes a first dielectric layer 108a, a second dielectric layer 108c, and a middle dielectric layer 108b sandwiched between the first dielectric layer 108a and the second dielectric layer 108c. Specifically, a dielectric constant of the middle dielectric layer 108b is substantially lower than a dielectric constant of the first dielectric layer 108a, and the dielectric constant of the middle dielectric layer 108b is substantially lower than a dielectric constant of the second dielectric layer 108c. According to the present embodiment, a material of the first dielectric layer 108a and the second dielectric layer 108c may be silicon oxide, silicon nitride, or silicon oxynitride, or other suitable materials for use as an example, although the invention is not limited thereto. In the present embodiment of the invention, the first dielectric layer 108a and the second dielectric layer 108c are substantially the same material, for example. However, in other embodiments, the first dielectric layer 108a and the second dielectric layer 108c may be different materials. Moreover, one of the first dielectric layer 108a and the second dielectric layer 108c may have a single layer or a multi-layer structure. The dielectric constant of the middle dielectric layer 108b is substantially greater or equal to 1 and the dielectric constant of the middle dielectric layer 108b is substantially lower than a dielectric constant of silicon oxide. In view of the foregoing, the middle dielectric layer 108b may have a single layer and a multi-layer structure, and a material of the middle dielectric layer 108b includes SiCO, porous SiCO, SiCN, porous SiCN, fluorine polymer, porous fluorine polymer, fluorinated silicon oxide, porous fluorinated silicon oxide, porous silica film, black diamond, porous back diamond, methyl silsesquioxane (MSQ), porous MSQ, hydrogen silsesquioxane (HSQ), porous HSQ, any other appropriate materials, or a combination thereof, for example.

For instance, a combination of the first dielectric layer 108a, the middle dielectric layer 108b, and the second dielectric layer 108c may be silicon oxide/dielectric layer having low dielectric constant/silicon nitride; silicon nitride/dielectric layer having low dielectric constant/silicon oxide; silicon oxide/dielectric layer having low dielectric constant/silicon oxide; or silicon nitride/dielectric layer having low dielectric constant/silicon nitride. Preferably, the combination of the first dielectric layer 108a, the middle dielectric layer 108b, and the second dielectric layer 108c is silicon oxide/dielectric layer having low dielectric constant/silicon nitride, although the invention is not limited thereto.

Moreover, in the passivation stacked layer 108, a thickness of the middle dielectric layer 108b is approximately between 5 nm and 500 nm, a thickness of the first dielectric layer 108a is approximately between 5 nm and 100 nm, and a thickness of the second dielectric layer 108b is approximately between 5 nm and 100 nm, for example. In other words, the thickness of the middle dielectric layer 108b is substantially greater than the thickness of the first dielectric layer 108a, and the thickness of the middle dielectric layer 108b is substantially greater than the thickness of the second dielectric layer 108c.

The contact layer 110 covers the passivation stacked layer 108 and electrically contacts with the back surface 102b of the semi-conductive substrate 102. More specifically, the contact layer 110 contacts the back surface 102b of the semi-conductive substrate 102 by passing through the passivation stacked layer 108. The contact layer 110 may have a single layer or a multi-layer structure, and a material of the contact layer 110 includes a metallic material. Preferably, the metallic material has high conductivity and high reflectivity, such as aluminum or other appropriate metals. Naturally, if the contact resistance issue is not considered, then the material of the electrode 107 may be adopted for the contact layer 110.

In the embodiment, the passivation stacked layer 108 disposed on the back surface 102b of the semi-conductive substrate 102 is formed by the first dielectric layer 108a, the second dielectric layer 108c, and the middle dielectric layer 108b sandwiched between the first dielectric layer 108a and the second dielectric layer 108c. Moreover, the dielectric constant of the middle dielectric layer 108b is substantially lower than the dielectric constant of the first dielectric layer 108a, and the dielectric constant of the middle dielectric layer 108b is substantially lower than the dielectric constant of the second dielectric layer 108c. Since the dielectric constant of the middle dielectric layer 108b is sufficiently low, therefore, when a light is incident upon the front surface 102a of the semi-conductive substrate 102 and enters the passivation stacked layer 108, the passivation stacked layer 108 has a preferable reflective efficiency of light. In particular, for an infrared light, the passivation stacked layer 108 has a preferable reflective efficiency of the infrared light.

Figure 2:
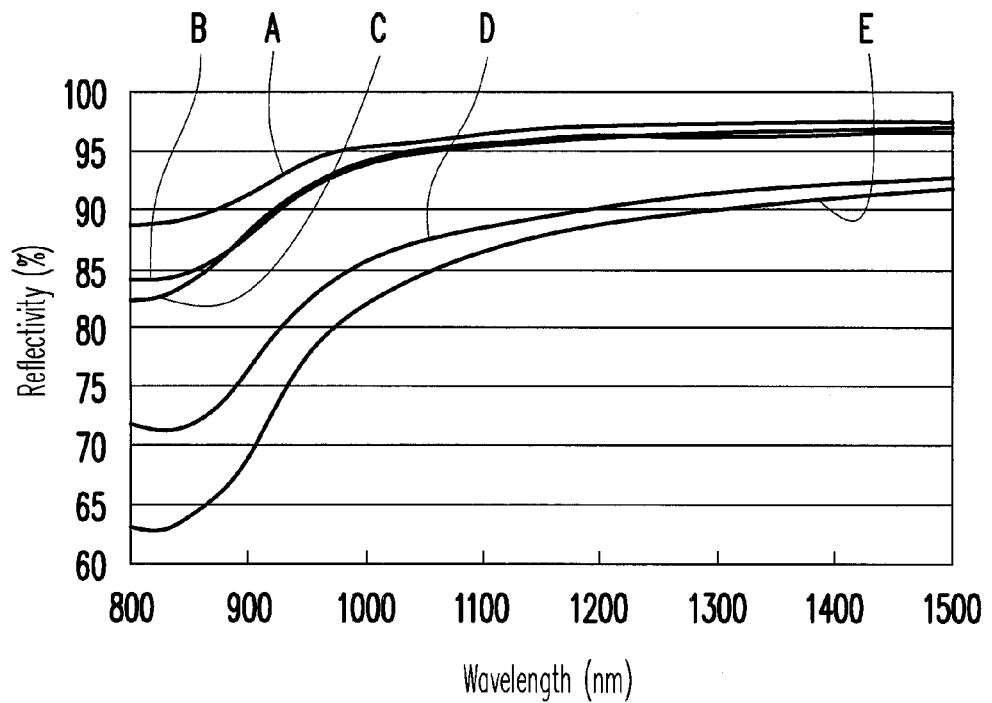
FIG. 2 illustrates a curve diagram of reflectivity and wavelength for five solar cell structures.

Five different passivation layer structures are used below to compare the reflectivities therebetween. FIG. 2 illustrates a curve diagram of reflectivity and wavelength for five solar cell structures. Referring to FIG. 2, curves A to E represent the relationships between the reflectivity and wavelength for five solar cell structures. In the solar cells represented by the curves A-E, the materials of the semi-conductive substrates (such as crystallized silicon doped with p-type ions), the doping layers (such as crystallized silicon doped with n-type ions), the anti-reflection layers (such as silicon nitride), the electrodes and the contact layers (such as Al) are the same, with the exception of the formation of the passivation layers being different.

In the solar cell represented by the curve A, the passivation layer is formed, as an example, by stacked layers of silicon oxide (such as thickness approximately 15 nm)/material having low dielectric constant (such as thickness approximately 100 nm)/silicon oxide (such as thickness approximately 15 nm), in which a dielectric constant of the material is approximately 3, for example. Moreover, the dielectric constant of the material is substantially lower than the dielectric constant of silicon oxide or silicon nitride.

In the solar cell represented by the curve B, the passivation layer is formed by stacked layers of silicon oxide (such as thickness approximately 15 nm)/silicon nitride (such as thickness approximately 100 nm).

In the solar cell represented by the curve C, the passivation layer is formed by stacked layers of silicon oxide (such as thickness approximately 15 nm)/silicon nitride (such as thickness approximately 100 nm)/silicon oxide (such as thickness approximately 15 nm).

In the solar cell represented by the curve D, the passivation layer is formed by stacked layers of silicon oxide (such as thickness approximately 15 nm).

In the solar cell represented by the curve E, no passivation layer is disposed.

As shown by the curve diagram in FIG. 2, the solar cell represented by the curve A has a preferable reflective efficiency. In particular, for infrared light having a wavelength between about 800 to about 1000 nm, the solar cell represented by the curve A exhibits a preferable reflective efficiency. In other words, the passivation layer is formed by a stacked structure, and the middle dielectric layer in the stacked structure has a low dielectric constant material. Moreover, this structure of the passivation layer has a preferable reflective efficiency.

In view of the foregoing, in a solar cell according to an embodiment of the invention, the passivation stacked layer includes the first electric layer, the middle dielectric layer, and the second dielectric layer, in which the dielectric constant of the middle dielectric layer is substantially lower than the dielectric constant of the first dielectric layer and the dielectric constant of the second dielectric layer. Since the dielectric constant of the middle dielectric layer is sufficiently low, therefore, the reflective efficiency of light in the solar cell can be enhanced. In particular, the reflective efficiency of infrared light in the solar cell is increased, thereby enhancing the performance of the solar cell. In other words, after a light (e.g. infrared light) passes through the anti-reflection layer 106, the doping layer 104, and the semi-conductive substrate 102, the reflectivity of light reflected by the passivation stacked layer 108 is high.

Furthermore, the passivation stacked layer according to the embodiment of the invention may be bonded with a dangling bond on a silicon surface or in a defect (e.g., dislocation, grain boundary, or point defect), thus effectively reducing the recombination rate of electrons and holes on the silicon surface and in the defect so as to prolong the lifetime of a small number of carriers, thereby enhancing the efficiency of the solar cell.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A solar cell, comprising:
   a semi-conductive substrate having a front surface and a back surface;
   a doping layer disposed on the front surface of the semi-conductive substrate;
   an anti-reflection layer disposed on the doping layer;
   an electrode disposed on the anti-reflection layer and electrically connected to the doping layer;
   a passivation stacked layer disposed on the back surface of the semi-conductive substrate, the passivation stacked layer comprising:
   a first dielectric layer;
   a second dielectric layer; and
   a middle dielectric layer sandwiched between the first dielectric layer and the second dielectric layer, wherein a dielectric constant of the middle dielectric layer is lower than a dielectric constant of the first dielectric layer and a dielectric constant of the second dielectric layer, wherein a thickness of the middle dielectric layer is larger than a thickness of the first dielectric layer and a thickness of the second dielectric layer; and
   a contact layer covering the passivation stacked layer and electrically contacting with the back surface of the semi-conductive substrate.

2. The solar cell of claim 1, wherein the dielectric constant of the middle dielectric layer is greater or equal to 1 and the dielectric constant of the middle dielectric layer is lower than a dielectric constant of silicon oxide.

3. The solar cell of claim 2, wherein the middle dielectric layer comprises SiCO, porous SiCO, SiCN, porous SiCN, fluorine polymer, porous fluorine polymer, fluorinated silicon oxide, porous fluorinated silicon oxide, porous silica film, black diamond, porous back diamond, methyl silsesquioxane (MSQ), porous MSQ, hydrogen silsesquioxane (HSQ), porous HSQ, or a combination thereof.

4. The solar cell of claim 1, wherein a thickness of the middle dielectric layer is approximately between 5 nm and 500 nm, a thickness of the first dielectric layer is approximately between 5 nm and 100 nm, and a thickness of the second dielectric layer is approximately between 5 nm and 100 nm.

5. The solar cell of claim 1, wherein the first dielectric layer and the second dielectric layer respectively comprises silicon oxide, silicon nitride, or silicon oxynitride.

6. The solar cell of claim 5, wherein the first dielectric layer comprises silicon oxide and the second dielectric layer comprises silicon nitride.

7. The solar cell of claim 5, wherein the first dielectric layer comprises silicon oxide and the second dielectric layer comprises silicon oxide.

8. The solar cell of claim 5, wherein the first dielectric layer comprises silicon nitride and the second dielectric layer comprises silicon nitride.

9. The solar cell of claim 1, wherein the semi-conductive substrate comprises a doped semiconductor material.

10. The solar cell of claim 1, wherein the contact layer comprises a metal.

11. A solar cell, comprising:
    a semi-conductive substrate having a front surface and a back surface;
    a doping layer disposed on the front surface of the semi-conductive substrate;
    an anti-reflection layer disposed on the doping layer;
    an electrode disposed on the anti-reflection layer and electrically connected to the doping layer;
    a passivation stacked layer disposed on the back surface of the semi-conductive substrate, the passivation stacked layer comprising:
    a first dielectric layer;
    a second dielectric layer; and
    a middle dielectric layer sandwiched between the first dielectric layer and the second dielectric layer, wherein a dielectric constant of the middle dielectric layer is lower than a dielectric constant of the first dielectric layer and a dielectric constant of the second dielectric layer, wherein the dielectric constant of the middle dielectric layer is greater or equal to 1 and the dielectric constant of the middle dielectric layer is lower than a dielectric constant of silicon oxide; and a contact layer covering the passivation stacked layer and electrically contacting with the back surface of the semi-conductive substrate.

12. The solar cell of claim 11, wherein the middle dielectric layer comprises SiCO, porous SiCO, SiCN, porous SiCN, fluorine polymer, porous fluorine polymer, fluorinated silicon oxide, porous fluorinated silicon oxide, porous silica film, black diamond, porous back diamond, methyl silsesquioxane (MSQ), porous MSQ, hydrogen silsesquioxane (HSQ), porous HSQ, or a combination thereof.

13. The solar cell of claim 11, wherein a thickness of the middle dielectric layer is approximately between 5 nm and 500 nm, a thickness of the first dielectric layer is approximately between 5 nm and 100 nm, and a thickness of the second dielectric layer is approximately between 5 nm and 100 nm.

14. The solar cell of claim 11, wherein the first dielectric layer and the second dielectric layer respectively comprises silicon oxide, silicon nitride, or silicon oxynitride.

15. The solar cell of claim 14, wherein the first dielectric layer comprises silicon oxide and the second dielectric layer comprises silicon nitride.

16. The solar cell of claim 14, wherein the first dielectric layer comprises silicon oxide and the second dielectric layer comprises silicon oxide.

17. The solar cell of claim 14, wherein the first dielectric layer comprises silicon nitride and the second dielectric layer comprises silicon nitride.

18. The solar cell of claim 11, wherein the semi-conductive substrate comprises a doped semiconductor material.

19. The solar cell of claim 11, wherein the contact layer comprises a metal.

* * * * *